(12) United States Patent
Nozières et al.

(10) Patent No.: US 8,228,716 B2
(45) Date of Patent: Jul. 24, 2012

(54) MAGNETIC ELEMENT WITH THERMALLY ASSISTED WRITING

(75) Inventors: Jean-Pierre Nozières, Le Sappey en Chartreuse (FR); Ioan Lucian Prejbeanu, Sassenage (FR)

(73) Assignee: Crocus Technology SA, Grenoble Cedex (FR)

( * ) Notice: Subject to any disclaimer, the term of this patent is extended or adjusted under 35 U.S.C. 154(b) by 28 days.

(21) Appl. No.: 12/872,873

(22) Filed: Aug. 31, 2010

(65) Prior Publication Data

US 2010/0328808 A1    Dec. 30, 2010

Related U.S. Application Data

(63) Continuation of application No. PCT/EP2009/053111, filed on Mar. 17, 2009.

(30) Foreign Application Priority Data

Mar. 18, 2008  (FR) ..................................... 08 51747

(51) Int. Cl.
    *G11C 11/00*    (2006.01)
(52) U.S. Cl. ......................... 365/158; 365/171; 365/173
(58) Field of Classification Search .................. 365/158, 365/171, 173
    See application file for complete search history.

(56) References Cited

U.S. PATENT DOCUMENTS

| | | | |
|---|---|---|---|
| 4,949,039 | A | 8/1990 | Grunberg |
| 5,159,513 | A | 10/1992 | Dieny et al. |
| 5,343,422 | A | 8/1994 | Kung et al. |
| 5,583,725 | A | 12/1996 | Coffey et al. |
| 5,640,343 | A | 6/1997 | Gallagher et al. |
| 6,021,065 | A | 2/2000 | Daughton et al. |
| 6,950,335 | B2 | 9/2005 | Dieny et al. |
| 6,958,927 | B1 | 10/2005 | Nguyen et al. |

(Continued)

FOREIGN PATENT DOCUMENTS

WO     2007025050 A2     3/2007

OTHER PUBLICATIONS

International Search report for PCT/EP2009/053111 dated Jul. 8, 2009.
Daughton, J.M.: "Magnetic Tunneling Applied to Memory (invited)", Journal of Applied Physics, vol. 81, 1997 American Institute of Physics, pp. 3758-3673.
Saito, Y; Amano, M.; Nakajima, K.; Takahashi, S.; Sagoi, M.: "Bias Voltage and Annealing-Temperature Dependences of Magnetoresistance Ratio in Ir-Mn Exchange-Biased Double Tunnel Junctions", Journal of Magnetism and Magnetic Materials 223 (2001) pp. 293-298.

*Primary Examiner* — Son Dinh
(74) *Attorney, Agent, or Firm* — Pearne & Gordon LLP

(57) ABSTRACT

Magnetic element with thermally-assisted magnetic-field writing or thermally-assisted spin-transfer writing, comprising: a reference magnetic layer having a fixed direction magnetization; a storage magnetic layer exchange-pinned with an antiferromagnetic layer, wherein the magnetization direction of the storage layer can vary when said element can be heated to a temperature at least higher than a critical temperature of the antiferromagnetic layer; a tunnel barrier, provided between the reference layer and the storage layer; wherein the magnetic reference layer, and/or the magnetic storage layer includes at least one electrically-resistive thin layer for heating the magnetic element. The magnetic element disclosed herein has a voltage gain of typically 10 to 50% compared to conventional magnetic elements and shows a reduction of the stress induced during a writing operation as well as a reduction of the aging.

11 Claims, 2 Drawing Sheets

U.S. PATENT DOCUMENTS

| | | |
|---|---|---|
| 6,980,486 B1 * | 12/2005 | Kneipfer et al. ............... 367/129 |
| 7,199,985 B1 * | 4/2007 | Sato et al. .................. 360/324.2 |
| 7,266,013 B2 * | 9/2007 | Daughton et al. ............ 365/158 |
| 7,414,881 B2 * | 8/2008 | Sugibayashi et al. ......... 365/158 |
| 2005/0254287 A1 | 11/2005 | Valet |
| 2006/0120126 A1 | 6/2006 | Nakamura et al. |

* cited by examiner

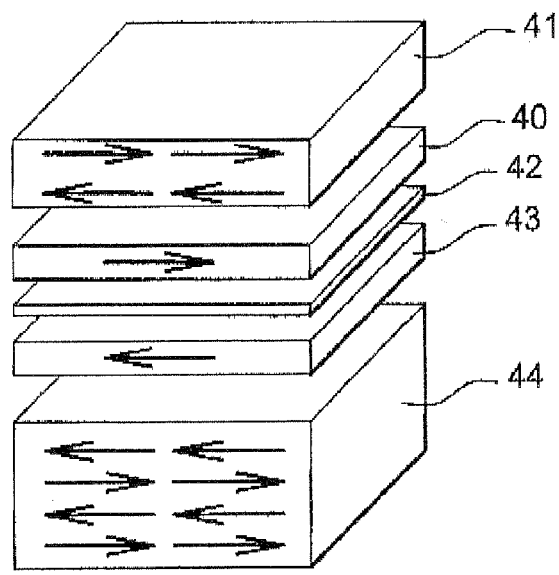
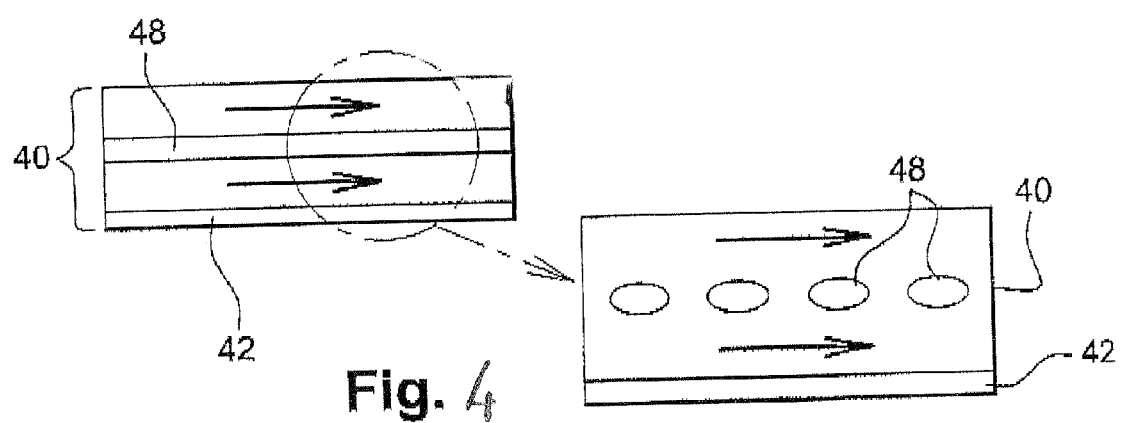

MAGNETIC ELEMENT WITH THERMALLY ASSISTED WRITING

TECHNICAL FIELD

The present invention relates to the field of magnetic elements with magnetic tunnel junction or spin valve, such as those used in magnetic non-volatile random access memories (NVRAM), for storing, reading and writing data in electronic systems in known ways. More specifically, it applies to magnetic random access memories, traditionally designated by the acronym MRAM, constituted of a set of memory points each formed by a magnetic tunnel junction, also designated by the acronym MTJ.

Hereinafter, a "magnetic element" is understood to be a stacking of magnetic layers having at least one so-called "reference" layer, one so-called "storage" layer and between them an insulation or semiconducting layer or a layer having a confined current path. The definition of the notion of reference layer and of storage layer will appear more precisely in the present description that follows.

BACKGROUND

Magnetic MRAM memories have met with renewed interest following the development of magnetic tunnel junctions having a high magnetoresistance at ambient temperature. These magnetic random access memories have indeed many advantages:
- a speed comparable with that of static random access memories (SRAM),
- non volatility, as in flash memories,
- absence of reading and writing degradation over time,
- insensitivity to ionizing radiations.

They are hence capable of replacing memories with a more traditional technology (DRAM, SRAM, flash) and thus of becoming a universal memory.

The first architectures of magnetic memories are constituted of a set of memory points or memory cells, each constituted of an element said to be with "giant magnetoresistive effect", constituted of a stack of several metallic layers alternatively magnetic and non magnetic.

This type of structure has for example been described in documents U.S. Pat. No. 4,949,039 and U.S. Pat. No. 5,159,513 for the basic structure and in document U.S. Pat. No. 5,343,422 for making a RAM memory from such basic structures.

This technology, thanks to its architecture, enables non-volatile memories to be made with a simple technology, albeit of limited capacity. The fact that the memory elements or points are connected serially along each line limits the possibility of integration, since the signal gets weaker and weaker as the number of memory elements or points increases.

The development of memory points with magnetic tunnel junction has made possible a significant increase in the performance and mode of operation of such memories. Such magnetic memories with magnetic tunnel junction have for example been described in document U.S. Pat. No. 5,640,343. In their simplest form, they are composed of two magnetic layers with different switching fields, magnetically decoupled with a thin insulation layer, called tunnel barrier. When the magnetization of the storage resp. reference layers constituting the two aforementioned magnetic layers and located on each side of the tunnel barrier are anti-parallel, the resistance of the magnetic tunnel junction is high. Conversely, when the magnetizations are parallel, this resistance becomes low.

The most classical architecture, called FIMS (acronym for Field Induced Magnetic Switching), i.e. the reversing of the magnetization by an external magnetic field, created by current or conductor lines associated to each of said magnetic points, is the one described in document U.S. Pat. No. 6,021,065 and in the publication "Journal of Applied Physics" vol. 81, 1997, page 3758 and represented in FIG. 1.

Each memory element or point 10 is constituted by the association of a transistor of CMOS technology 12 and of a magnetic tunnel junction MTJ 11. Said tunnel junction 11 comprises at least one magnetic layer 20, called "storage layer", one thin insulation layer 21 and one magnetic layer 22 called "reference layer".

Preferably, the two magnetic layers 20 and 21 are made from 3d metals (Fe, Co, Ni) and their alloys (capable of containing boron or zirconium so as to render the structure of said layers amorphous and to flatten their interfaces), and the insulation layer 21 is traditionally constituted of amorphous alumina (AlOx) or of crystalline or textured magnesium oxide (MgO).

Advantageously, the reference layer can itself be constituted of a stack of several layers, such as described for example in document U.S. Pat. No. 5,583,725, in order to constitute a synthetic antiferromagnetic layer (SAF). In the same way, it is possible to replace, for each of the memory points, the single magnetic tunnel junction by a double magnetic tunnel junction, such as described for example in publication Y. Saito & al, Journal of Magnetism and Magnetic Materials, Volume 223, 2001, page 293. In this case, the storage layer is provided between two insulation layers, with the structure comprising two reference layers placed on the sides opposite said respective insulation layers.

The magnetic field pulses produced by having short electric pulses, typically of 2 to 50 nanoseconds and of an intensity on the order of several milliamperes, circulate in the current lines 14 and 15, ensure the writing selectivity of the memory point localized at the intersection of these current lines. The intensity of these pulses and their synchronization are indeed adjusted so that only the magnetization of the memory point located at the intersection of these two current lines is capable of switching.

Due to the writing mechanism of these memory points, it is possible to understand the limitations of this architecture:
  Inasmuch as the writing is ensured by an external magnetic field, it is subject to the value of the individual switching field of each memory point. As the distribution function of the switching fields for all of the memory points is wide (it is indeed not uniform because of manufacturing constraints and intrinsic statistical fluctuations), it is necessary that the magnetic field on the selected memory point be greater than the highest distribution switching field, with the risk of accidentally reversing certain memory points located on the corresponding line or column, where the switching field located in the lower part of the distribution is weaker than the magnetic field generated by the line or column alone.
  Furthermore, considering that in general, the average value of the switching field increases when the size of the memory points diminishes, which one strives to achieve for reasons of space and cost, an ever higher current is expected in future product generations. Therefore, the electric power required for operating these memories will be all the greater as integration becomes more and more advanced.
  Finally, the stability of the magnetization of the free layer with respect to heat fluctuations is no longer guaranteed when the size of the memory point diminishes. Indeed, the energy barrier that needs to be overcome to make the magnetization of this layer switch from one orientation to the other is proportional to this layer's volume. When the volume decreases, the height of this barrier then becomes comparable to the thermal agitation. The information written into the memory is then no longer maintained. To remedy this difficulty, it is necessary to increase the magnetic anisotropy of the free layer by selecting a material with a stronger anisotropy or by increasing the shape anisotropy of the memory point, for example. By doing this, however, the magnetic field necessary for the magnetic switching increases, which results in an increased electric consumption for generating the field necessary to the magnetic switching.

Also, in order to overcome this difficulty, we have suggested using thermally-assisted magnetic random access memories, designated by the acronym TA-MRAM. The particularity of the memory point stacking in this architecture is the pinning of the storage layer by an antiferromagnetic layer with a critical temperature lower than that of the second antiferromagnetic layer pinning the reference layer. This technique is for example described in document U.S. Pat. No. 6,385,082.

In this configuration, selectivity to writing is achieved by a short increase of the temperature of the first memory addressed, achieved by a current pulse going through said considered memory point. To write the point, this temperature increase is then combined either with a magnetic field pulse, or with the spin transfer phenomenon achieved by injecting a spin polarized current through the storage layer of said memory point.

The typical stacking of a characteristic memory point for thermally-assisted magnetic random access memories TA-MRAM is represented in FIG. 2. In this stacking of the magnetic tunnel junction 31, the storage layer 40 is pinned by an antiferromagnetic layer 41. In the same manner as in the case of FIMS memories, an insulation layer 42 is comprised between the storage layer 40 and the reference layer 43. According to this configuration, the two magnetic layers are advantageously made in 3d transition metals (Fe, Co, Ni) and their alloys, preferably doped (with boron or zirconium notably), and the insulation layer can be alumina or magnesium oxide. In an advantageous embodiment, the magnetic reference layer 43 is coupled with an antiferromagnetic layer 44 whose function is to block the layer 43 so that its magnetization does not switch during writing. The critical temperature of the antiferromagnetic layer 44 pinning the reference layer 43 is much greater than the critical temperature of the antiferromagnetic layer 41 pinning the storage layer 40.

Here again, the magnetic reference layer 43 can be a synthetic antiferromagnetic layer constituted of several layers.

According to this embodiment, the antiferromagnetic layer 41 has a so-called "critical" final temperature BT above which the stabilizing so-called "exchange" magnetic field it exerts on the free layer 40 is no longer effective on the storage layer 40. The material making up the antiferromagnetic layer 41 as well as its thickness are selected so that the critical temperature BT is greater than the temperature of use of the memory (idle operating temperature). In the same manner, the critical temperature BT of the antiferromagnetic layer 44 adjacent to the pinned layer 43 is selected to be greater than and quite distant from the critical temperature of the antiferromagnetic layer 41.

This particular architecture has two or three levels of current lines depending on whether the switching is achieved by spin transfer or by magnetic field. First, for writing by magnetic field, a current line 30 called "field line" is located under the magnetic tunnel junction 31 without being in contact with the latter. This line is designed to generate the magnetic field necessary for reversing the storage layer 40 as soon as an electric current of several milliamperes goes through it and generates a temperature rise exceeding the critical temperature of the antiferromagnetic layer 41 pinning the storage layer 40. This line does not exist when the switching is achieved by injection of a spin-polarized current. Secondly, another current line 32 called "bit line" is located above the magnetic tunnel junction 31 of the memory point considered and in contact with it. Finally, a third current line 33 called "word line" is in contact, through a via 34, with a CMOS (complementary metal oxide semiconductor) transistor 35 whose "word line" constitutes the grid. In the same way as for the FIMS architecture, in a TA-MRAM architecture the "word line" controls the opening or closing of the transistors' channel over its entire length by applying or not a threshold voltage, with each of the transistors operating in switch mode for each of the associated memory points.

In writing mode, the CMOS transistor 35 of the memory point to be written is closed by applying an adequate voltage in the "word line" 33. A heating current is then sent in the memory point to be written by the "bit line" 32. Above a certain density of the current, the latter induces a temperature rise of the magnetic tunnel junction 31 beyond the critical temperature of the antiferromagnetic layer 41. The exchange field stabilizing the free layer 40 then becomes zero and said storage layer can be written at very reduced fields. To write the storage layer 40, an electric pulse is then sent into the field line 30 once the critical temperature has been reached (after several nanoseconds). This pulse generates a sufficient magnetic field to return the magnetization of the storage layer 40 to the desired direction (writing of the bit "1" or "0"). For a switching by injection of spin polarized current, the heating current is used both for heating the storage layer of the memory point and for applying a spin transfer torque onto the magnetization of this layer. To this effect, the flow of electrons of the heating current must be spin polarized, which is generally achieved by having it go through an additional magnetic field called polarization layer—in the case of the stack of FIG. 2, this role is played by the reference layer. Once the storage layer 40 has been written, the heating current is then cut in the magnetic tunnel junction 31 (by cutting the current in the "bit line" 32 and opening the transistor 35). The global temperature of the memory point then falls very rapidly (several nanoseconds) below the critical temperature of the antiferromagnetic layer 41 (typically to the idle operating temperature) and the exchange field reverts to its initial value but in opposite direction, stabilizing again the storage layer 40.

Such magnetic memories with thermally-assisted writing have a number of advantages, among which can be mentioned:
  a significant improvement in the writing selectivity due to the fact that only the memory point to be written is heated;
  the maintaining of the information written in the memory even when the memory point is exposed to parasite magnetic fields at ambient temperature;
  an improvement of the thermal stability of the information by using materials with a strong magnetic anisotropy at ambient temperature (intrinsic or due to the exchange anisotropy field of the antiferromagnetic layer pinning the storage layer 40);
  the possibility of reducing significantly the size of the memory point cells without affecting their stability limit by using materials with a strong magnetic anisotropy at ambient temperature or with a storage layer pinned by exchange anisotropy;

a reduction of the consumption during writing;

the possibility of obtaining multi-level storage cells in certain circumstances.

Despite these advantages, there are however some difficulties in terms of manufacturing technology.

The main difficulty is linked to the need to apply a current pulse through the magnetic tunnel junction in order to heat the memory point to a temperature greater than the critical temperature of the antiferromagnetic layer pinning the storage layer. This current pulse is liable to subject the ultra-thin oxide layer constituting the tunnel barrier to a considerable electric stress. The associated voltage could indeed reach or even exceed, in systems not adapted from the point of view of thermal confinement, the breakdown voltage of such an oxide layer, which is typically around 1 Volt. Furthermore, even if the voltage applied onto the tunnel barrier is lower than its breakdown voltage, the stress linked to the electric current pulse can result in considerable aging effects in the long term, notably after a great number of writing cycles.

Document US2006120126 discloses a magnetic junction having a first and a second ferromagnetic layer having each a magnetization pinned in an essentially opposite direction, and a free third ferromagnetic layer placed between the first and second layers. The junction also comprises two resistive intermediary layers, one between the first and third ferromagnetic layer and the other between the second and third ferromagnetic layer. The presence of intermediary layers makes it possible to lower the magnitude of critical current required for reversing the magnetic field of the free ferromagnetic layer.

In document US2005254287, a magnetic junction comprises a blocked ferromagnetic layer and a free ferromagnetic layer written by spin transfer, the two layers being separated by layer having a confined current path. The junction also comprises an additional spin barrier layer and/or spin accumulation layer, the free layer being located between the layer having a confined current path and the spin barrier layer and the additional layer. The latter allows the efficiency of the spin injection to be increased when the magnetization is reversed by spin transfer.

A weaker spin current for reversing the magnetization is also achieved with the junction described in document WO2007025050 and having an insulation layer, located between a pinned ferromagnetic layer and a free ferromagnetic layer, as well as a spin accumulation layer located adjacent to the free layer and allowing a greater magnetoresistance of the junction.

Similarly, the magnetic junction described in document U.S. Pat. No. 6,958,927 allows a weaker spin current to be used for writing the free ferromagnetic layer thanks to the presence of a semimetal layer on the surface of the reference layer.

In order to simultaneously maintain a sufficient considerable current injected through the memory point whilst minimizing the voltage at the terminals of the oxide layer constituting the tunnel barrier, it has been proposed in the past to use a double tunnel junction, i.e. two magnetic tunnel junctions separated from one another by a metallic layer, such as described for example in document U.S. Pat. No. 6,950,335. By doing this, for the same power density, which constitutes the critical memory-point heating parameter, one achieves a considerable diminution of the voltage at the terminals of each of the tunnel barriers. However, this double magnetic tunnel junction has an increased complexity as regards the making of the stack and of the memory cells, notably during the burning phase of the memory point.

Furthermore, using a double magnetic tunnel junction has disadvantages for an architecture of writing based on spin transfer. Indeed, if the magnetizations of the two magnetic reference layers are blocked in anti-parallel fashion, the efficiency of the spin torque is considerable but the value of the resistances of the two memory states becomes comparable and, subsequently, the reading margin finds itself drastically reduced.

Alternatively, if the magnetizations of the two magnetic reference layers are blocked in parallel, the reading margin is considerable but the efficiency of the spin torque is significantly reduced inasmuch as the two contributions for both reference layers are subtracted from one another.

BRIEF SUMMARY OF THE INVENTION

The aim of the present invention is to propose an innovative system making it possible to maintain a sufficient considerable current injected through the memory point whilst minimizing as much as possible the voltage at the terminals of the ultra-thin oxide layer constituting the ultra-thin tunnel barrier. This will allow to achieve both a spin torque and/or temperature rise sufficiently efficient for writing the memory point and to minimize the risks of breakdown and ageing of the tunnel barrier.

Another aim of the present invention is to minimize the voltage through the thin oxide layer, constituting the tunnel barrier, for a determined current density, i.e. for a given heating amplitude and/or spin torque whilst maintaining the same reading margin level in terms of resistance or magnetoresistance.

To this effect, the invention's aims are achieved by a magnetic element with thermally-assisted magnetic-field or spin-transfer writing, including:

a reference magnetic layer having a fixed direction magnetization;

a storage magnetic layer coupled magnetically with a pinning layer made of antiferromagnetic material and whose magnetization direction can vary when the system is heated to a temperature higher than the critical temperature of the antiferromagnetic layer;

a tunnel barrier provided between the reference layer and the storage layer.

According to the invention, the magnetic reference layer and/or the magnetic storage layer can include at least one electrically-resistive thin layer for heating the magnetic element.

Here, said at least one electrically-resistive thin layer means, as it is normally understood by the one skilled in the art, a layer whose resistivity is appreciably greater to the magnetic layers of the magnetic element, such as for example the magnetic storage layer or magnetic reference layer.

Using such layers with a high electric resistivity and highly reduced thickness, notably on the order of or less than one nanometer, enables the resistance of the staking of the magnetic tunnel junction to be optimized without at the same time affecting the characteristic resistance of the layer constituting the tunnel barrier and provided between the storage layer and the reference layer.

Advantageously, this at least one thin layer with high electric resistivity can be introduced in the ferromagnetic layers making up the storage layer and the reference layer, or even in the antiferromagnetic exchange layer pinning the reference layer or on their surface or interface.

Typically, and according to the invention, this or these thin layer(s) with high electric resistivity can be made of metal oxides or nitrides, the metal being chosen in the group comprising tantalum, aluminum, cobalt, zirconium, zinc and magnesium.

These oxide or nitride layers can be achieved by deposition of ultra-thin metallic layers, typically with a thickness lower than the mono-layer, notably by cathode deposition (also known by the expression "sputtering"). These metallic layers can be oxidized subsequently, by natural oxidation or by plasma, or nitridized by a deposition in a partial nitrogen atmosphere.

The thickness of these oxide or nitride layers is preferably less than one nanometer in order to obtain layers that are preferably discontinuous, allowing the continuity of the magnetic properties of the ferromagnetic or antiferromagnetic layers to which they are introduced to be maintained.

According to the invention, all or part of the magnetic layers constituting said double layer or layers of the storage layer can include a thin metal oxide or nitride layer.

This solution notably has the advantage over the prior art of a voltage gain of typically 10 to 50% when one or several highly resistive thin layers are introduced in the magnetic junction. This results in a reduction of the stress induced during the writing operation as well as a reduction of the aging effects of the junction. The presence of one or several thin layers in the magnetic element of the invention also allows the magnetic junction to be heated more efficiently.

BRIEF DESCRIPTION OF THE FIGURES

The manner in which the invention can be executed and the advantages that result will become better apparent from the following description of embodiment, given by way of non-limiting example in support of the attached figures in which:

FIG. 3 is a diagrammatic representation of a memory point used in the framework of the magnetic memory with thermally-assisted writing of FIG. 2; and FIG. 4 is a detailed representation of the storage layer of the memory point of FIG. 3.

EXAMPLE(S) OF EMBODIMENTS OF THE INVENTION

Figure 1:
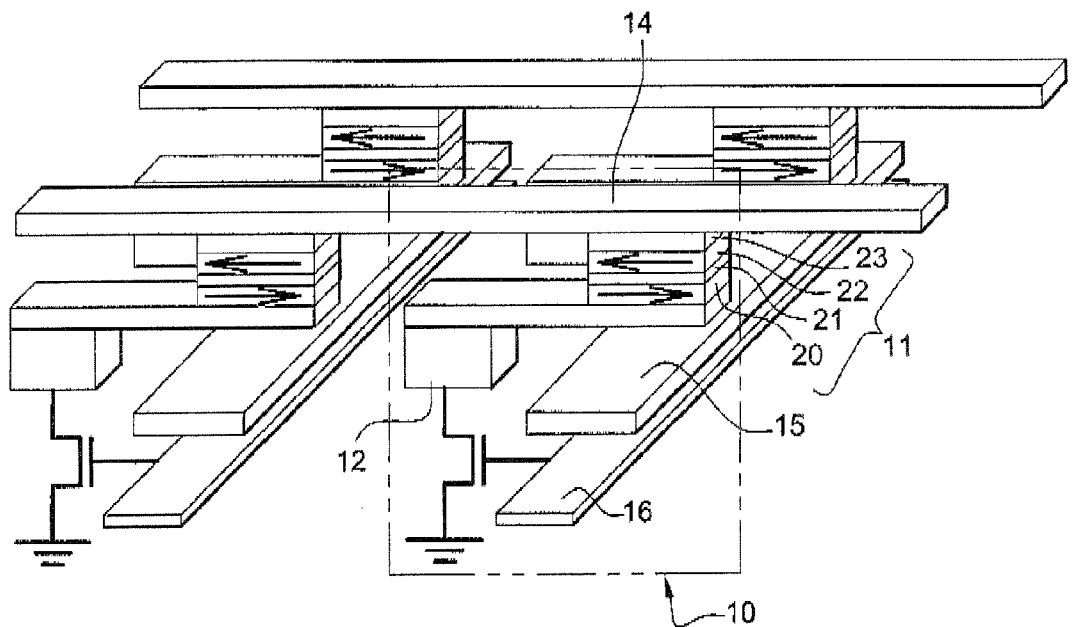
FIG. 1, already described, is a diagrammatic representation of the architecture of a magnetic memory of FIMS type from the prior state of the art.
Figure 2:
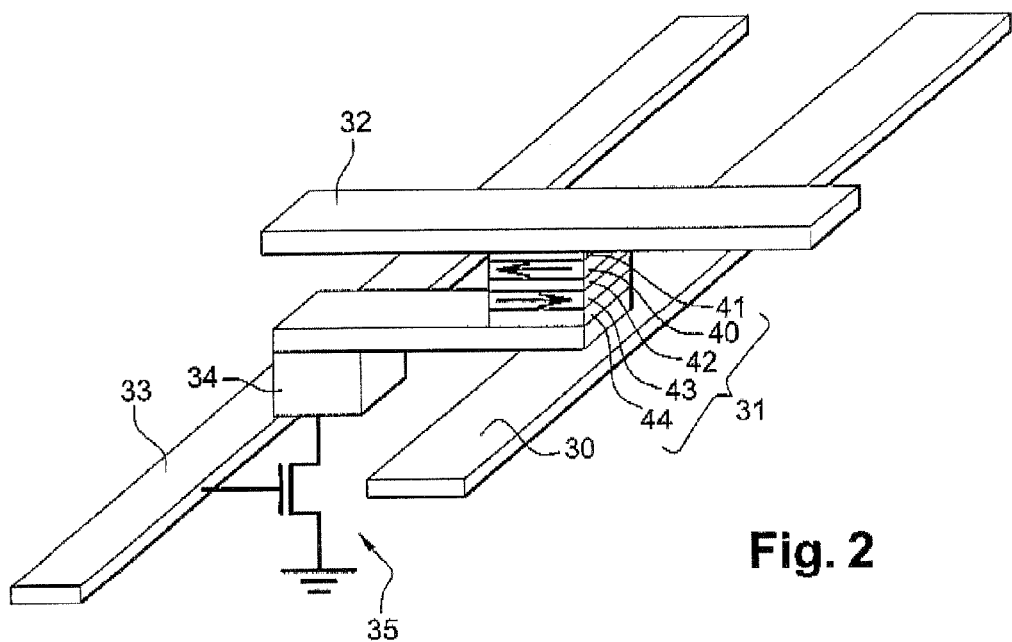
FIG. 2, also already described, is a diagrammatic representation of a magnetic memory using a MRAM memory with thermally-assisted writing, also known from the prior state of the art.

The prior state of the art relative to random access magnetic memories has been abundantly described in the preamble of the present invention.

In doing so, and with the aim of simplifying the present description, a single memory point constituting such magnetic memories will be descried hereinafter in more detail.

As has already been said, the latter is fundamentally constituted of a magnetoresistive magnetic element, preferably a magnetic tunnel junction 31. The later comprises a tunnel barrier 42, selected in the group including among others aluminum oxides $Al_2O_3$ and magnesium oxides MgO.

Alternatively, the layer 42 separating the reference layer 43 from the storing layer 40 can be of semi-conducting nature (for example on the basis of silicon or germanium or of GaAs) or a heterogeneous metal/oxide layer, such as layers having a confined current path developed in the context of magnetoresistive reader heads for hard drives. These are for example constituted of $Al_{1-x}Cu_x$ alloys with x being comprised between 0.5 and 10% by atomic weight, which are oxidized, forming an amorphous alumina layer bored with metal copper holes.

In the aim sought by the present invention, if the characteristic resistance of the tunnel barrier 42 is not to be affected, however, one aims to increase the resistance of the storage layer and/or of the reference layer.

To this effect, according to the invention, a very thin layer 48 of a metal oxide or nitride, typically but in non-limiting fashion constituted of tantalum, aluminum, cobalt, zirconium, zinc or magnesium oxide (nitride) is deposited in and/or on the surface of the ferromagnetic layer 43 making up the reference layer and/or of the ferromagnetic layer 40 making up the storage layer, or ever at the interface between the layers 40 and 43 with the antiferromagnetic layers 41 and 44 to which they are respectively coupled.

This layer 48 preferably has a subnanometer thickness, i.e. at most equal to 1 nanometer, so as not to affect the magnetic properties of the magnetic layer to which it is associated.

This deposition can be achieved by cathode sputtering of a subnanometer metal layer that is oxidized subsequently by natural oxidation or by plasma. Alternatively, the metallic layer can be nitridized by deposition of the metallic layer in a partial nitrogen atmosphere. Alternatively, the oxide can be deposited directly by sputtering in a reactive plasma.

In one embodiment of the invention, at least one thin layer 48 with a high electric resistivity is deposited on one of the faces of the ferromagnetic layer 43 making up the reference layer and/or of the ferromagnetic layer 40 making up the storage layer. For example, in the case of the junction 31 comprising an antiferromagnetic layer 41 pinning the storage layer 40 and an antiferromagnetic layer 44 pinning the reference layer 43, the thin layer 48 is deposited at the interface between the storage layer 40 and antiferromagnetic layer 41 and/or at the interface between the reference layer 43 and the antiferromagnetic layer 44.

In a preferred embodiment of the invention, the thin layer or layers 48 are deposited inside the ferromagnetic layer 43 making up the reference layer and/or of the ferromagnetic layer 40 making up the storage layer.

In another embodiment of the invention, these thin layers 48 are introduced in the antiferromagnetic exchange layer 44 pinning the reference layer or in the antiferromagnetic exchange layer 41 pinning the storage layer.

Positioning the thin resistive layer or layers 48 inside the ferromagnetic layer 40 or also in the antiferromagnetic exchange layer 41 is advantageous since it promotes the temperature rise close to the ferromagnetic layer 40 which needs to be heated beyond its critical temperature.

The metal oxide layer or layers 48 thus executed are advantageously discontinuous, as illustrated in FIG. 4, precisely in order to ensure the continuity of the magnetic properties of the ferromagnetic or antiferromagnetic layers in which, on which or at the interface of which they are deposited.

By using such metal oxide or nitride layers, the total resistance of the stack can be increased without affecting the characteristic resistance of the tunnel barrier 42. In doing this, the heating efficiency is increased, notably during the writing phase, inasmuch as the latter is proportional to the expression $RI^2$, wherein R represents the sum of the resistance of the tunnel barrier $R_{MTJ}$, and of the resistance of the metal oxide or nitride layer thus deposited $R_{NOL}$. Consequently, the corresponding voltage $V_{MTJ}$ decreases at the tunnel barrier due to the introduction of these additional resistors.

Thus, considering a constant power density, we have the expressions:

$$\frac{I_{MTJ+NOL}}{I_{MTJ}} = \sqrt{\frac{R_{MTJ}}{R_{MTJ} + R_{NOL}}}$$

$$V_{MTJ}^{avecNOL} = R_{MTJ} I_{MTJ+NOL}$$

$$= V_{MTJ}^{sansNOL} \sqrt{\frac{R_{MTJ}}{R_{MTJ} + R_{NOL}}}$$

where $V_{MTJ}^{avecNOL}$ designates the voltage at the terminals of the magnetic tunnel junction 31 integrating one or several layers of metal oxide (NOL for Nano Oxide Layer) and where $V_{MTJ}^{sansNOL}$ designates the voltage at the terminals of the magnetic tunnel junction in the absence of such layers.

Typically, the resistance of the metal oxide layer or layers 48 on the basis of aluminum or tantalum is comprised between 0.5 et 5Ω/μm² depending on the thickness and the conditions of execution. Typically, the resistance of the metal oxide layer or layers 48 is substantially ten times lower than the resistance of the semiconducting layer 42.

If one considers the product of the resistance times the surface area of the metal oxide layer of 5Ω/μm², and of the tunnel junction of 50Ω/μm², the voltage gain is approximately 5% for each of the metal oxide layers introduced into the structure.

If one uses a multiple stack structure for the storage layer in which several metal oxide layers are introduced according to the invention, the magnitude of the decrease in electric stress can reach 30%.

For a product RA (resistance times area) close to 20Ω/μm2, the voltage gain can be even greater, typically 10% for a single metal oxide layer to 50% for the introduction of such a metal oxide layer in a storage layer constituted of 10 double layers (magnetic layer+amorphous layer).

The MRAM magnetic memories thus obtained have a strongly improved endurance inasmuch as the stress induced by the writing phase is considerably reduced and the voltage applied at the magnetic tunnel junction during the reading phase is low, typically less than 200 mV.

In the case of the configuration of thermally-assisted magnetic random access memories (TA-MRAM) and more particularly in the frame of thermally-assisted magnetic memories by injection of spin-polarized current (Spin-Transfer Torque MRAM or STT-MRAM), essential to achieve dimensional characteristics less than or equal to 90 nanometers, a considerable current must go through said magnetic tunnel junction. The solution proposed by the invention using metal oxide or nitride layers as the effect of reducing the voltage at the tunnel junction, thus enabling this configuration to be used more easily.

One thus conceives of the interest presented by the present invention for making magnetic memories using such memory elements, notably in the frame of the optimization of the number of reading and writing cycles and the reduction of the current necessary for writing.

REFERENCE NUMBERS USED IN THE FIGURES 11 magnetic tunnel junctions
14 current lines
15 current lines
20 storage layer
21 insulation layer
22 reference layer
30 current line (field line)
31 magnetic tunnel junction
32 other current line (bit line)
33 third current line (word line)
34 via
35 CMOS transistor
40 storage layer
41 antiferromagnetic layer
42 insulation layer (tunnel barrier)
43 reference layer (ferromagnetic layer)
44 antiferromagnetic layer
48 fine layer (thin layer)
$R_{MTJ}$ resistance of the tunnel barrier
$\overline{R_{NOL}}$ resistance of the thin layer
$\overline{I_{MTJ}}$ predetermined constant current going through the junction
$V_{MTJ}$ voltage at the terminals of the junction
$\overline{V_{MTJ}}^{avecNOL}$ voltage at the terminals of the junction integrating one or several thin layers
$V_{MTJ}^{sansNOL}$ voltage at the terminals of the junction in the absence of such layers

The invention claimed is:

1. Magnetic element with thermally-assisted magnetic-field writing or thermally-assisted spin-transfer writing, comprising:
    a reference magnetic layer having a fixed direction magnetization;
    a storage magnetic layer exchange-pinned with an antiferromagnetic layer, wherein the magnetization direction of the storage layer can vary when said element can be heated to a temperature at least higher than a critical temperature of the antiferromagnetic layer;
    a tunnel barrier provided between the reference layer and the storage layer;
    characterized in that
    the magnetic reference layer and/or the magnetic storage layer includes at least one electrically-resistive thin layer for heating the magnetic element.

2. Magnetic element according to claim 1, wherein said at least one thin layer is comprised inside and/or on one of the faces of the ferromagnetic layer making up the reference layer and/or of the storage layer.

3. Magnetic element according to claim 1, wherein said at least one thin layer is comprised at the interface between the storage layer and antiferromagnetic layer.

4. Magnetic element according to claim 1, wherein said at least one thin layer is further comprised inside the antiferromagnetic layer.

5. Magnetic element according to claim 1, further comprising an antiferromagnetic layer pinning the reference layer within which said at least one thin layer is also comprised.

6. Magnetic element according to claim 1, wherein said at least one thin layer has an electric resistivity substantially ten times lower than the resistance of the tunnel barrier.

7. Magnetic element according to claim 1, wherein the thickness of said at least one thin layer is at most equal to one nanometer.

8. Magnetic element according to claim 1, wherein said at least one thin layer is discontinuous.

9. Magnetic element according to claim 1, wherein said at least one thin layer is made of metal oxide or metal nitride.

10. Magnetic element according to claim 9, wherein the metal coming into the composition of the metal oxide or nitride making up said at least one thin layer is chosen in the group including tantalum, aluminum, magnesium, zirconium, zinc and cobalt.

11. MRAM magnetic memory comprising a plurality of a magnetic elements with thermally-assisted magnetic-field writing or thermally-assisted spin-transfer writing, each comprising: a reference magnetic layer having a fixed direction magnetization; a storage magnetic layer exchange-pinned with an antiferromagnetic layer, wherein the magnetization direction of the storage layer can vary when said element can be heated to a temperature at least higher than a critical temperature of the antiferromagnetic layer; a tunnel barrier provided between the reference layer and the storage layer; wherein the magnetic reference layer and/or the magnetic storage layer includes at least one electrically-resistive thin layer for heating the magnetic element.

* * * * *